United States Patent [19]
Maekawa

[11] Patent Number: 5,834,835
[45] Date of Patent: Nov. 10, 1998

[54] SEMICONDUCTOR DEVICE HAVING AN IMPROVED STRUCTURE FOR STORING A SEMICONDUCTOR CHIP

[75] Inventor: Hideaki Maekawa, Kawasaki, Japan

[73] Assignee: Kabushiki Kaisha Toshiba, Kawasaki, Japan

[21] Appl. No.: 634,678

[22] Filed: Apr. 18, 1996

[30] Foreign Application Priority Data

Apr. 21, 1995 [JP] Japan ................................. 7-096367

[51] Int. Cl.⁶ ........................ H01L 23/02; H01L 23/495
[52] U.S. Cl. ........................ 257/680; 257/778; 257/81; 257/82; 257/432; 257/787
[58] Field of Search ................................. 257/690, 676, 257/666, 787, 668, 672, 723, 778, 786, 680, 82, 84, 81, 99, 432; 361/813, 25.5

[56] References Cited

U.S. PATENT DOCUMENTS

| | | | |
|---|---|---|---|
| 5,357,056 | 10/1994 | Nagano | 257/680 |
| 5,491,362 | 2/1996 | Hamzehdoost et al. | 257/680 |
| 5,498,906 | 3/1996 | Roane et al. | 257/680 |
| 5,523,586 | 6/1996 | Sakurai | 257/680 |
| 5,710,071 | 1/1998 | Beddingfield et al. | 257/778 |
| 5,721,450 | 2/1998 | Miles | 257/480 |

FOREIGN PATENT DOCUMENTS

| | | | |
|---|---|---|---|
| 1732400 A1 | 5/1992 | Germany | 257/680 |
| 1-24445 | 1/1989 | Japan | 257/680 |
| 1-89544 | 4/1989 | Japan | 257/680 |

*Primary Examiner*—Tom Thomas
*Assistant Examiner*—Alexander Oscar Williams
*Attorney, Agent, or Firm*—Finnegan, Henderson, Farabow, Garrett & Dunner, L.L.P.

[57] ABSTRACT

In the semiconductor of the present invention, the first pair of pad lines consisting of a plurality of pads are arranged on the bottom portion of the recess portion of the enclosure, the recess portion being made at the center portion of the enclosure by the counterboring process to have a predetermined depth. At approximately center of the recess portion, a suction opening is made so as to suck the potting material from outside. In the recess portion of the enclosure, the semiconductor chip is supported. The semiconductor chip has the second pair of pad lines arranged to oppose to the first pair of pad lines and electrically connected to the first pair of pad lines respectively. The potting material is poured into the recess portion so as to completely cover the semiconductor chip. At the same time, the potting material is sucked from the suction opening.

4 Claims, 5 Drawing Sheets

SEMICONDUCTOR DEVICE HAVING AN IMPROVED STRUCTURE FOR STORING A SEMICONDUCTOR CHIP

BACKGROUND OF THE INVENTION

1. Field of the Invention

The present invention relates to a semiconductor device of an improved version of a structure including an enclosure, designed for a high density and a high integration, and a method of manufacturing such a semiconductor device.

2. Description of the Related Art

Conventionally, there are SOP (small output package) having a metal lead frame, SOJ (small output J character of lead) and the like, as an enclosure for a semiconductor. The structure of such enclosures is, in many cases, larger than an actual semiconductor chip, making it difficult to increase density and integration.

Further, the structure in which the above-described semiconductor device is mounted on a print wiring board, entails the following drawback. That is, due to a difference in thermal expansion coefficient between the mold resin and the metal lead frame used in the semiconductor device and the print wiring board, a joint portion of solder is stressed as the device undergoes a temperature cycle between high temperature and low temperature, over a long term period. Thus, in many cases, a crack is created in the joint portion, making it impossible to maintain its electrical conduction.

As a solution to the cracking of solder joint, not the mold resin, but the glass epoxy material, which is used for the print wiring board, is used as the material for protecting a semiconductor chip. In this manner, the problem due to the difference in the thermal expansion coefficient between materials is removed.

In the meantime, in order to increase the density and the degree of integration, a structure such a flip chip or a COB (chip on board), in which a semiconductor chip is directly mounted on a print wiring board, is conventionally employed.

However, in such a structure, a semiconductor chip is mounted directly on a print wiring board, and therefore the structure is weak to mechanical shock as compared to the case of a resin-sealed type semiconductor device. Further, the structure requires a new manufacturing device or a new technique, to be formed.

Moreover, another technique is conventionally used in order to increase the density and the degree of integration in plane. That is, in place of the metal lead frame, a plurality of semi-columnar metal contact portions 10 are arranged in parallel on both side surfaces of the enclosure of a semiconductor device as members designed for electrical contact of the semiconductor device with an external device, as can be seen in FIG. 1 and FIG. 2.

The above-described conventional technique is directed at increasing in the density and the degree of integration of the device from a two-dimensional point of view. FIG. 1 and FIG. 2 illustrate a structure of an example that is directed to an increase in the density and the degree of integration of the device from a three-dimensional point of view.

As can be seen in these figures, while stacking a plurality of semiconductor devices one on another, they are jointed at all levels by, for example, their semi-columnar metal contact portions 10. Thus, the devices are mounted in a multi-level manner in order to increase the density and the degree of integration in terms of a three-dimensional point of view.

FIG. 2 is a cross sectional view taken along the line II—II of FIG. 1, showing the structure of the conventional resin-sealed type semiconductor device shown in FIG. 1. The following is a detailed explanation of the above-mentioned structure.

A glass epoxy material 3 is subjected to a counterboring process, so as to make a recess portion 8 at a center portion thereof. Further, a bed section 9 on which a semiconductor chip can be placed, is formed at the center portion.

On the bed section 9, a semiconductor chip 6 is placed via a mounting agent 7. A contact pad 1 provided on the semiconductor chip 6 is electrically connected via a bonding wire 4 to a bonding pad 5 provided in the recess portion 8.

The recess portion 8 is filled with a potting agent 2, thus sealing the semiconductor element 6.

At the lower bottom of the glass epoxy material 3, an electric conduction confirmation pad 11 for confirming whether or not the contact pad 1 is electrically connected to the bonding pad 5 via the bonding wire 4, is provided.

A plurality of semi-columnar metal contact portions 10 are arranged in parallel on both side surfaces of the glass epoxy material 3 along its longitudinal direction.

The manufacturing process for the conventional resin-sealed type semiconductor device is illustrated in FIGS. 3A to FIG. 3F in steps.

As can be seen in FIG. 3A, the mounting agent 7 is applied on the bed portion 9 of the glass epoxy material 3, which has been subjected to the counterboring process, and is provided with the bonding pad 5 and the electric connection confirmation pad 11, and a semiconductor chip 6 is placed on the mounting agent 7.

Then, as can be seen in FIG. 3B, the mounting agent 7 is heated to be cured, thus fixing the semiconductor chip 6 placed on the amounting agent 7.

Subsequently, as can be seen in FIG. 3C, each contact pad 1 on the semiconductor chip 6 is electrically connected to a respective bonding pad 5 via a bonding wire 4.

As shown in FIG. 3D, the recess portion 8 is filled with the potting agent 2, and thus the semiconductor chip 6 is sealed.

Then, as shown in FIG. 3E, after the recess portion 8 is filled with the potting agent 2, the potting agent 2 is degassed under a low pressure.

As shown in FIG. 3F, after the degassing, the potting agent 2 is heated to be cured.

However, the structure of the semiconductor device including the above-described enclosure entails the following drawbacks.

First, as shown in FIG. 2, the glass epoxy material 3 and the semiconductor chip 6 are electrically connected via the bonding wire 4. In the case where the electrical connection is conducted by means of the bonding wire 4, the bonding pad 5 should be formed on the glass epoxy material 3, so as to project outwards from the outside dimension of the semiconductor chip 6.

With this structure, the resin-sealed type semiconductor device has an increased outside dimension, and therefore such a structure is not suitable for increasing the density and the degree of integration of the device.

Second, as shown in FIG. 2, it is necessary to provide a step for electrically bonding members using a bonding wire 4, and a step in which the semiconductor chip 6 is adhered onto the glass epoxy material 3 with use of the mounting agent 7. Therefore, the number of manufacturing steps is increased, and accordingly, the production cost is increased.

As described above, the conventional semiconductor device entails the problems such as an increase outside dimension of the device and an increased number of manufacturing steps therefor.

SUMMARY OF THE INVENTION

The present invention has been proposed so as to solve the above-described drawbacks, and the object thereof is to provide a semiconductor device having a relatively small outside dimension and involving a low production cost, with reduction of the number of the manufacturing steps, and a method of manufacturing such a device.

In order to achieve the above-described object, the present invention provides a semiconductor device comprising:

enclosure means having a central portion subjected to a counterboring process, to be made into a recess portion having a predetermined depth, said recess portion having a suction opening at substantially a center for sucking a potting material into the recess portion from outside;

a first pair of pad lines in which a plurality of pads are arranged, provided on a bottom portion of the recess portion of said enclosure means;

a semiconductor chip supported by said enclosure means, having a second pair of pad lines each electrically connected to a respective one of said pads via a spherical metal member, and arranged to oppose said first pair of pad lines within the recess portion of said enclosure means; and a potting material supplied into said recess portion so as to completely cover said semiconductor chip.

Further, the present invention provides a method of manufacturing a semiconductor device, comprising the steps of:

arranging a first pair of pad lines consisting of a plurality of pads, in a recess portion of enclosure means, said recess portion being formed at a center portion of said enclosure means by an counterboring process so as to have a predetermined depth;

bonding pads of a second pair of pad lines of a semiconductor chip, arranged to oppose to said first pair of pad lines in the recess portion of said enclosure means, collectively to pads of said first pad lines respectively via metal spherical means;

making said semiconductor chip supported by said enclosure means;

supplying a potting material into said recess portion; and covering said semiconductor chip with said potting material by supplying the potting material into said recess portion while sucking said potting material from a suction opening formed at a center portion of the recess portion of said enclosure means.

With the above-described constitutions, the semiconductor device and the method of manufacturing the same, according to the present invention, exhibit the following advantages. That is, the first and second pad lines can be formed immediately underneath the semiconductor chip, and therefore the outside dimension of the semiconductor device can be lessened. Further, since bonding wires are not used, the height of the enclosure can be reduced. These features all contribute to an increase in the density and the degree of integration of the semiconductor device.

Further, in the present invention, the pads are bonded collectively all at once by means of metal spherical means, and at the same time, the semiconductor chip is adhered to the enclosure by means of an insulating material. Therefore, the number of manufacturing steps can be decreased, and accordingly the production cost can be lowered.

Further, in the present invention, while the potting material is supplied into the recess portion, the material is sucked from the through-hole made at substantially the center of the recess portion of the enclosure. Therefore, the insufficient filling of the potting material into the recess portion, supplied to cover the semiconductor chip, can be prevented. Thus, the reliability of the device can be increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

An embodiment of the semiconductor device according to the present invention will now be described with reference to accompanying drawings.

Figure 1:
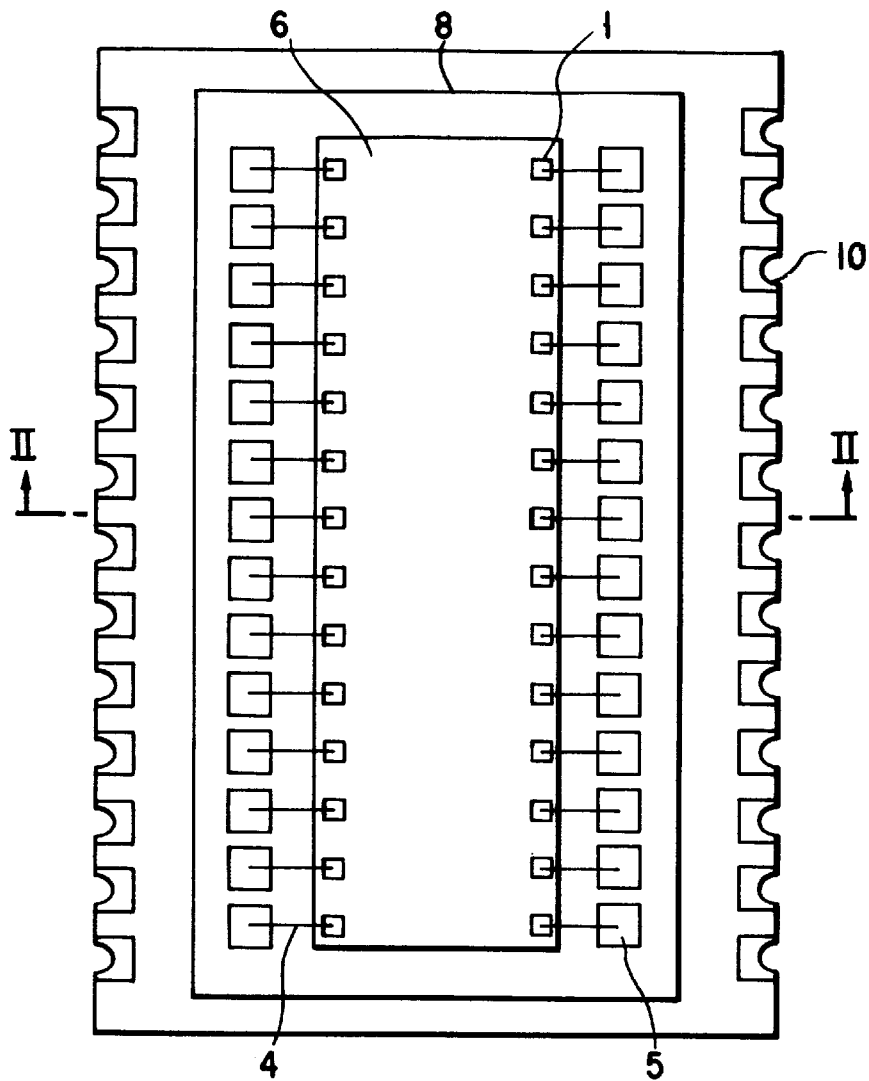
FIG. 1 is a plan view of a semiconductor device including a conventional enclosure.
Figure 2:
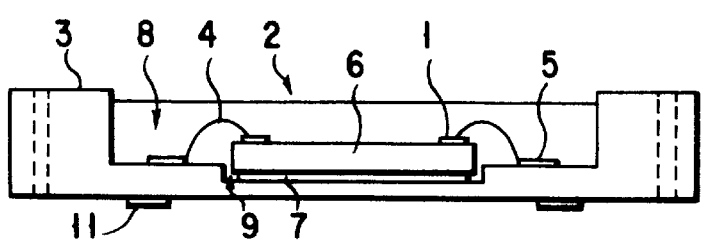
FIG. 2 is a cross sectional view taken along the line II—II in FIG. 1.
Figure 3A:
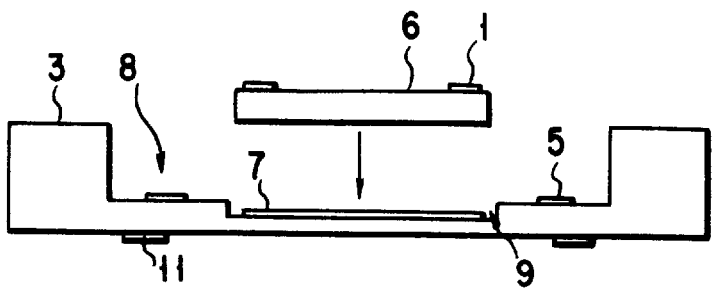
FIG. 3A to FIG. 3F are cross sectional views each showing the steps of a method of manufacturing a semiconductor device including a conventional enclosure.
Figure 3B:
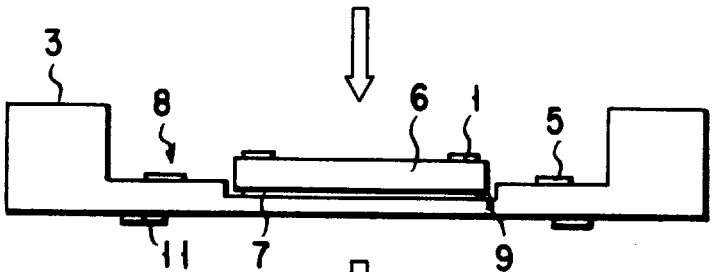
Figure 3C:
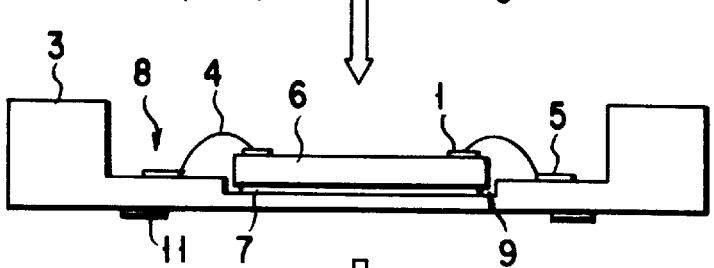
Figure 3D:
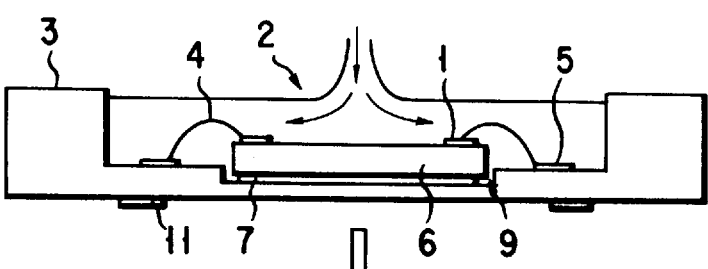
Figure 3E:
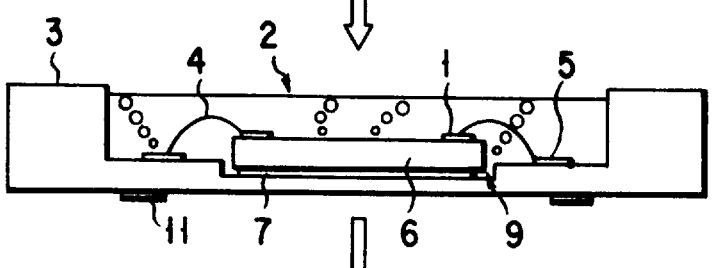
Figure 3F:
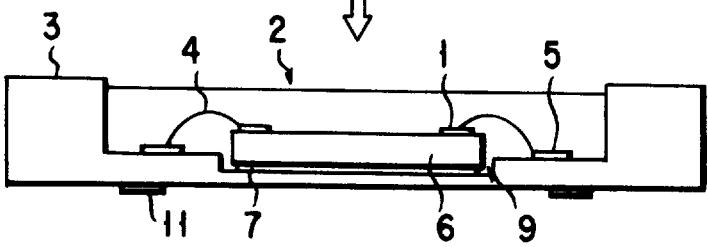
Figure 4:
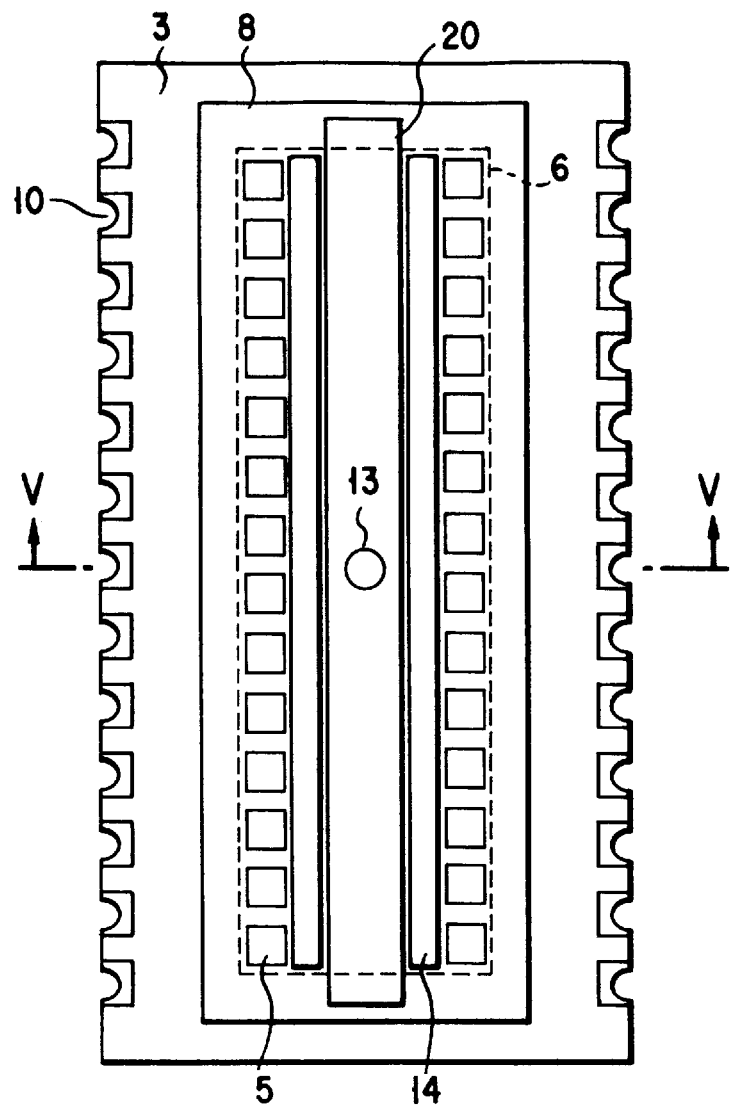
FIG. 4 is a plan view of a semiconductor device including an enclosure of the present invention.
Figure 5:
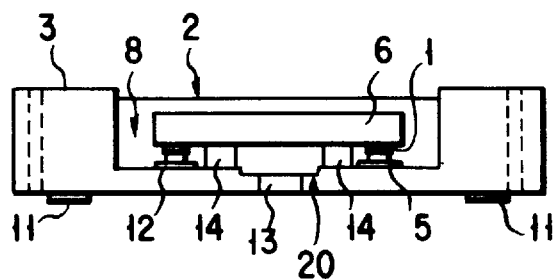
FIG. 5 is a cross sectional view taken along the arrow V—V in FIG. 4.

FIG. 4 is a plan view of a resin-sealed type semiconductor device including an enclosure of the present invention. According to the resin-sealed type semiconductor device of the present invention, a glass epoxy material 3 is subjected to a counterboring process, in which a recess portion 8 is formed at a center portion of the glass epoxy material 3.

Further, at approximately the center of the recess portion 8, a hole is made to serve as a suction opening 13 for a potting material. At a center portion of the recess portion 8 including the suction opening 13, a recess portion 20 is further formed in the longitudinal direction of the recess portion 8, so as to assure a wide area for sucking the potting material. The dimension of the recess portion 20 in its longitudinal direction is larger than that of the semiconductor chip 6 in its longitudinal direction.

A semiconductor element 6 is adhered to insulating adhesive tapes 14 provided on both sides of the recess portion 20, and supported within the recess portion 8.

A contact pad 1 provided on the semiconductor chip 6 is electrically connected to a bonding pad provided in the recess portion 8 via a spherical metal member 12.

The recess portion 8 is filled with a potting agent 2, and thus the semiconductor element 6 is sealed.

During the sealing operation, the potting agent 2 which is being filled, is sucked from the suction opening 13. Thus, the recess can be completely filled without making a gap space within an inner side surface of the semiconductor chip 6 supported within the recess.

On the lower bottom of the glass epoxy member 3, an electrical conduction confirming pad 11 used for confirming whether or not the contact pad 1 is electrically connected to the bonding pad 5 via the spherical metal member 12, is provided.

A plurality of semi-columnar metal contact members 10 are arranged on both side surfaces of the glass epoxy member 3 in the longitudinal direction.

Next, the manufacturing process of the resin-sealed type semiconductor device according to the present invention will be described with reference to FIG. 6A to FIG. 6E.

Figure 6A:
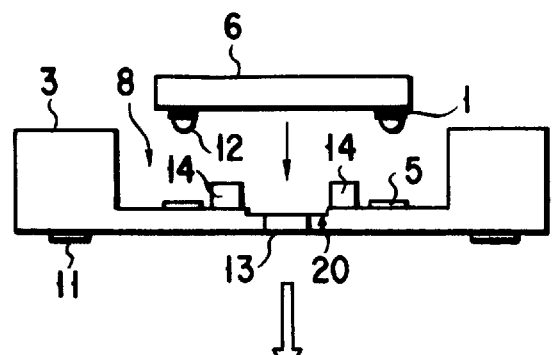
FIG. 6A to FIG. 6E are cross sectional views each showing the steps of a method of manufacturing a semiconductor device including an enclosure of the present invention.
Figure 6B:
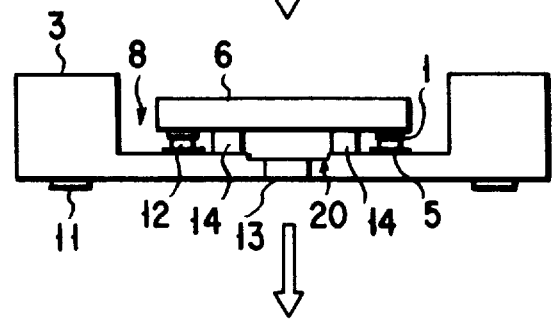

As can be seen in FIG. 6A, the glass epoxy member 3 is subjected to a counterboring process, in which the recess portion 8 is formed at a center portion of the glass epoxy material 3. Further, at approximately the center of the recess portion 8, a hole is made to serve as the suction opening 13 for a potting material. At a center portion of the recess portion 8 including the suction opening 13, the recess portion 20 is further formed in the longitudinal direction of the recess portion 8, so as to assure a wide area for sucking the potting material. The dimension of the recess portion 20 in its longitudinal direction is larger than that of the semiconductor chip 6 in its longitudinal direction.

On both sides of the recess portion 20, insulating adhesive tapes 14 are provided. The semiconductor chip 6 is adhered to the insulating adhesive tapes 14 and thereby supported in the recess portion 8. Then, each of the bonding pads 5 of the bonding pad lines provided in the recess portion 8 is made to oppose to a respective one of the contact pads 1 of the contact pad lines provided on the semiconductor chip 6, and they are electrically connected by a spherical metal member. Thus, the bonding pad lines and the contact pad lines are bonded collectively at once.

At the same time, the semiconductor chip 6 is fixed as the insulating adhesive tapes 14 is cured by heat, and thus supported on the glass epoxy member 3.

Figure 6C:
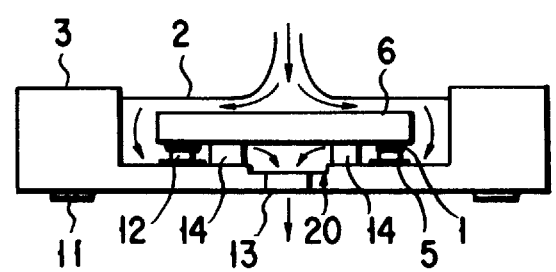

Next, as can be seen in FIG. 6C, the potting agent 2 is supplied into the recess portion 8 to protect the semiconductor chip 6 from contacting to outside, or the like. At the same time, the potting agent 2 is sucked from the suction opening 9. In this manner, the potting agent 2 can be supplied sufficiently into the gap between the bottom of the recess portion 8 and the semiconductor chip 6, and therefore the entire semiconductor chip 6 can be completely covered.

During the above step, it may be considered that a portion of the potting agent 12 flows out of the suction opening 13. However, the overflow of the potting agent 2 can be prevented by setting appropriate conditions such as the viscosity of the potting agent 2, the suction force and the suction time.

Figure 6D:
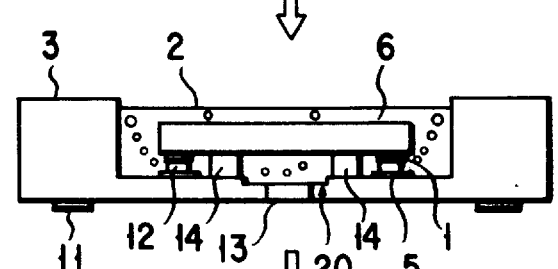
Figure 6E:
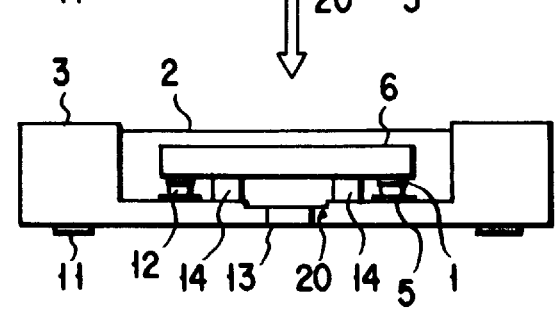

Then, as can be seen in FIG. 6D, the potting agent 2 is degassed and then cured by heating. Thus, a semiconductor device having an improved structure including its enclosure, and having a high density and a high degree of integration, is completed as shown in FIG. 6E.

Figure 7:
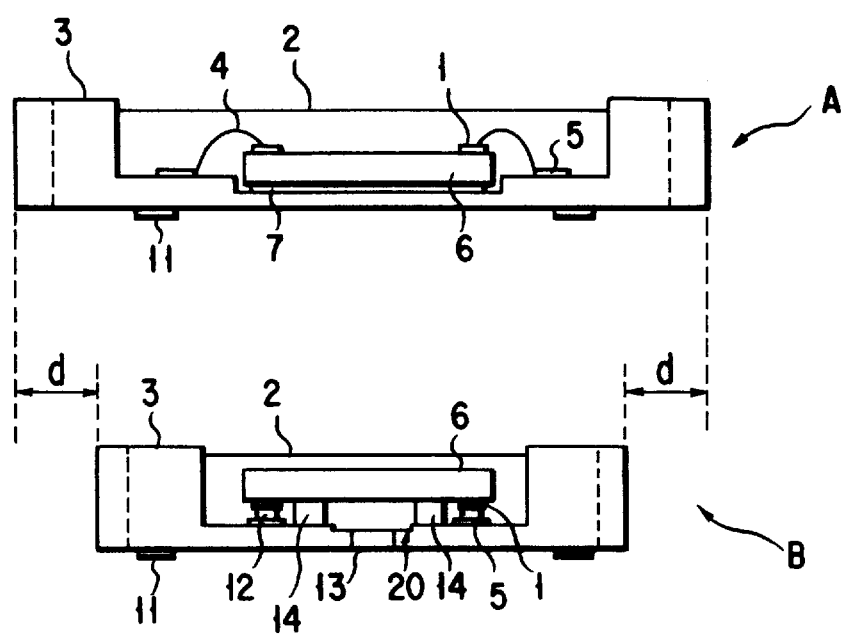
FIG. 7 is a diagram illustrating a comparison between the semiconductor including the conventional enclosure and the semiconductor including the enclosure of the present invention, in terms of outside dimension.

As is clear from FIG. 7, according to a conventional technique (A), a contact pad 1 provided on a semiconductor chip 6 is electrically connected to a bonding pad 5 provided in the recess portion 8 via a bonding wire 4, and therefore the bonding pad 5 must be formed to project outwards from the semiconductor chip 6, enlarging the outside dimension of the semiconductor device. In contrast, according to the present invention (B), the contact pad 1 is electrically connected to the bonding pad 5 via the spherical metal member 12 immediately underneath the semiconductor chip 6, and therefore the outside dimension can be reduced as compared to that of the conventional technique by a measurement corresponding to 2d in the figure.

Further, with use of a spherical metal member 12, the height of the electrical contact portion can be made lower than the loop height of the bonding portion, and therefore the thickness of the semiconductor device can be reduced. Consequently, the density and the degree of integration of the semiconductor device can be increased as compared to those of the conventional technique.

Furthermore, according to the conventional electrical bonding by means of the bonding wire 4, each contact pad 1 and each bonding wire 4 must be bonded together one by one. In the present invention, with use of the spherical metal members 12, the bonding pad lines and the contact pad lines are respectively bonded together collectively at once, and at the same time, the semiconductor chip 6 can be adhered to the insulating adhesive tape 14. Therefore, the number of the manufacturing steps can be decreased, and accordingly, the production cost can be lowered.

In the meantime, according to the present invention, the electric contact portion is replaced by the spherical metal members 12 while reducing the height, as described above. As a result, a space between the bottom portion of the recess portion 8 of the glass epoxy material 3 and the semiconductor chip 6, becomes so narrow that it is not easy for the potting agent 2 to enter the space. In order to remove this drawback, the recess portion 20 which is made longer than the longitudinal dimension of the semiconductor chip 6, is provided in the section interposed between the insulating adhesive tapes 14, for the purpose of assuring a wide suction area for the suction opening 13 formed in the bottom of the recess portion 8 of the glass epoxy member 3.

With this structure, as can be seen in FIG. 6C, the potting agent 2 is supplied into the recess portion 8 of the glass epoxy member 3 and at the same time, the potting agent is sucked from the suction opening 9. In this manner, the potting agent 2 can be drawn to the section between the bottom portion of the glass epoxy member 3 and the semiconductor chip 6, and therefore the semiconductor chip 6 can be completely covered.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   enclosure means having a central portion subjected to a counterboring process, to be made into a recess portion having a predetermined depth, said recess portion having suction opening at substantially a center thereof for sucking a potting material into said recess portion from outside the semiconductor device;

a first pair of pad lines in which a plurality of pads are arranged, provided on a bottom portion of said recess portion of said enclosure means;

a semiconductor chip supported by said enclosure means, having a second pair of pad lines, each electrically connected to a respective one of said pads via a spherical metal member, and arranged to oppose to said first pair of pad lines within said recess portion of said enclosure means; and a potting material supplied into said recess portion to cover all surfaces of said semiconductor chip without any gap.

2. A semiconductor device according to claim 1, wherein said enclosure means is made of a glass epoxy material.

3. A semiconductor device according to claim 1, wherein said semiconductor chip is adhered to an insulating adhesive tape and supported in said enclosure means.

4. A semiconductor device according to claim 1, wherein said enclosure means comprises a second recess portion which communicates with said suction opening, formed at approximately a center of a bottom portion of said recess portion in a longitudinal direction.

* * * * *